United States Patent [19]
Dubbelday et al.

[11] Patent Number: 5,661,313
[45] Date of Patent: Aug. 26, 1997

[54] ELECTROLUMINESCENT DEVICE IN SILICON ON SAPPHIRE

[75] Inventors: Wadad B. Dubbelday, Spring Valley; Randy L. Shimabukuro; Stephen D. Russell, both of San Diego, all of Calif.

[73] Assignee: The United States of America as represented by the Secretary of the Navy, Washington, D.C.

[21] Appl. No.: 614,783

[22] Filed: Mar. 8, 1996

Related U.S. Application Data

[63] Continuation-in-part of Ser. No. 118,900, Sep. 9, 1993.
[51] Int. Cl.$^6$ .......................... H01L 33/00; H01L 47/00
[52] U.S. Cl. .................... 257/103; 257/3; 257/79; 257/91; 257/99; 257/764; 257/762; 257/768
[58] Field of Search .......................... 257/3, 79, 103, 257/461, 463, 466, 768, 769, 770

[56] References Cited

U.S. PATENT DOCUMENTS

| | | |
|---|---|---|
| 3,683,240 | 8/1972 | Pankove . |
| 3,922,703 | 11/1975 | Pankove .................................. 257/76 |
| 4,684,964 | 8/1987 | Pankove et al. . |
| 4,882,297 | 11/1989 | Blossfeld ............................... 437/200 |
| 4,884,112 | 11/1989 | Lorenzo et al. . |
| 4,990,988 | 2/1991 | Lin . |
| 5,122,845 | 6/1992 | Manabe et al. . |
| 5,144,390 | 9/1992 | Matloubian . |
| 5,215,931 | 6/1993 | Houston . |
| 5,281,830 | 1/1994 | Kotaki et al. . |
| 5,281,831 | 1/1994 | Uemoto et al. ......................... 257/102 |
| 5,324,965 | 6/1994 | Tompsett et al. . |
| 5,331,180 | 7/1994 | Yamada ..................................... 257/3 |
| 5,384,517 | 1/1995 | Uno ....................................... 315/169.3 |

Primary Examiner—Mahshid D. Saadat
Assistant Examiner—Allan R. Wilson
Attorney, Agent, or Firm—Harvey Fendelman; Michael A. Kagan; Eric James Whitesell

[57] ABSTRACT

Electroluminescent devices are formed on a transparent sapphire substrate as follows. Crystalline silicon is formed on the sapphire substrate and patterned into a mesa. An electrode of, for example, titanium silicide, is formed in the silicon around the mesa, and an electrically insulating layer is formed over the electrode. The crystalline silicon is exposed on the mesa, and a porous silicon layer is formed on the crystalline silicon. An electrode made of aluminum, for example, is formed on the porous silicon layer. This electrode need not be transparent. An outer insulating layer may be formed on the aluminum electrode and additional electrodes may be formed on and through the outer insulating layer to make electrical contact with the titanium silicide and aluminum electrodes, respectively. A voltage source may be connected to the electrodes to pass a current through the porous silicon to cause light to be emitted from the porous silicon through the sapphire substrate.

18 Claims, 5 Drawing Sheets

ELECTROLUMINESCENT DEVICE IN SILICON ON SAPPHIRE

CROSS-REFERENCE TO RELATED APPLICATIONS

This is a continuation-in-part application under 37 CFR 1.53 of co-pending U.S. patent application Ser. No. 08/118,900 filed Sep. 9, 1993.

BACKGROUND OF THE INVENTION

The present invention relates to electroluminescent displays. More specifically, but without limitation thereto, the present invention relates to an electroluminescent semiconductor formed in porous silicon-on-sapphire.

For many years, silicon has found extensive applications in military and commercial electronics, but was unsuitable for electro-optic applications because single crystal silicon is not an efficient emitter of light. Electro-optic devices that are formed in other semiconductors include laser diodes, optical links between chips, and high speed communications interfaces for fiberoptic cables. Flat panel displays and other devices might benefit substantially from light emitting diodes formed as elements of integrated circuits.

Recently, promising discoveries have been reported in photoluminescent and electroluminescent devices formed in porous silicon. See, for example, "Optoelectronic Applications of Porous Polycrystalline Silicon" by Kalkhoran, Namavar, and Maruska. Because electroluminescence in porous polycrystalline silicon could only be observed from the substrate opposite the gold electrode, the substrate was made of a transparent material such as glass or quartz. However, these materials are not compatible with standard silicon semiconductor manufacturing processes. Also, the gold electrode has an adverse effect on the carrier lifetime in silicon and is less readily etched than other metals. A need therefore exists for an electroluminescent device that may be made with materials that are compatible with silicon manufacturing processes.

SUMMARY OF THE INVENTION

The electroluminescent devices of the present invention are directed to overcoming the problems described above, and may provide further related advantages. No embodiment of the present invention described herein should be construed to preclude other embodiments or advantages that may exist or become obvious to those skilled in the art.

Electroluminescent devices of the present invention are formed on a transparent sapphire substrate. Crystalline silicon is formed on the sapphire substrate and patterned into a mesa. An electrode of, for example, titanium silicide, is formed in the silicon around the mesa, and an electrically insulating layer is formed over the electrode. The crystalline silicon is exposed on the mesa, and a porous silicon layer is formed on the crystalline silicon. An electrode made of aluminum, for example, is formed on the porous silicon layer. This electrode need not be transparent. An outer insulating layer may be formed on the aluminum electrode and additional electrodes may be formed on and through the outer insulating layer to make electrical contact with the titanium silicide and aluminum electrodes, respectively. A voltage source may be connected to the electrodes to pass a current through the porous silicon to cause light to be emitted from the porous silicon through the sapphire substrate.

Alternatively, other optoelectronic devices such as phototransistors, cross-bar switches, light emitting arrays, and the like may be readily fabricated according to the present invention.

A plurality of devices of the present invention may also be arranged advantageously to reduce the size, weight, and power consumption of optoelectronic applications.

An advantage of the present invention is that current silicon manufacturing technology may be used to integrate electronic circuitry with electroluminescent devices.

Another advantage is that the reflectivity of the aluminum electrode causes light to be reflected towards the sapphire substrate, thus increasing the light output of the electroluminescent device.

Yet another advantage is the low resistance of the aluminum electrode compared to transparent conductors such as indium tin oxide.

Still another advantage is that a high quality single crystal film may be formed on a transparent substrate that may be integrated more readily with high-performance CMOS microelectronics than polycrystalline silicon.

Yet another advantage is that a variety of other optoelectronic devices may be integrated with electronic circuits in similar fashion as the light emitting diode.

The features and advantages summarized above in addition to other aspects of the present invention will become more apparent from the description, presented in conjunction with the following drawings.

DESCRIPTION OF THE INVENTION

The following description is presented solely for the purpose of disclosing how the present invention may be made and used. The scope of the invention is defined by the claims.

Figure 1A:
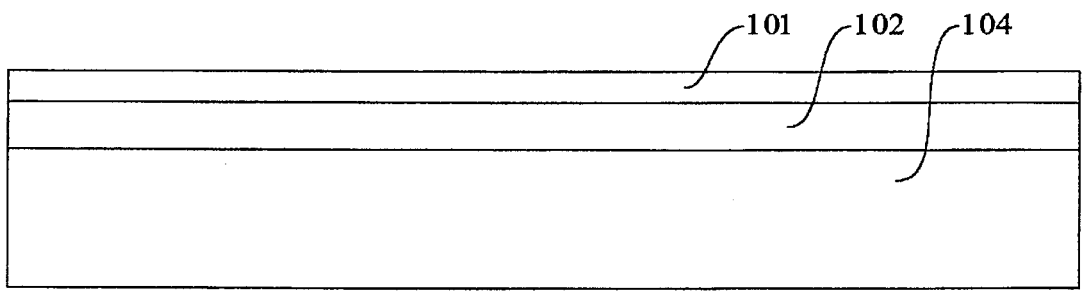
FIGS. 1A–1H are cross-sectional views of an electroluminescent device of the present invention with porous silicon.
Figure 1B:
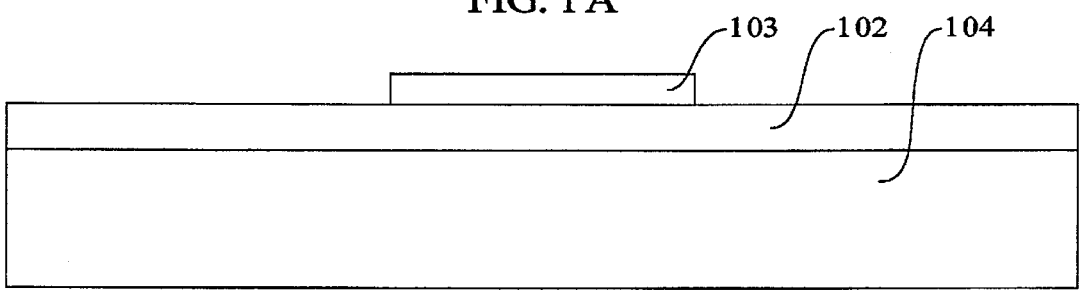

Referring to FIG. 1A, a layer of crystalline silicon 102 is deposited on a polished surface of a sapphire substrate 104. Crystalline silicon layer 102 may be improved, for example, as described in U.S. Pat. No. 4,177,084, "METHOD OF PRODUCING LOW DEFECT LAYER OF SILICON-ON-SAPPHIRE WAFER" by S. Lau, et al incorporated herein by reference thereto. Crystalline silicon layer 102 may also contain n-type or p-type dopants appropriate to the application. A layer of silicon dioxide 101 is deposited on crystalline silicon layer 102. In FIG. 1B, silicon dioxide layer 101 is patterned into silicon dioxide mesa 103 by, for example, photolithography and etching by either a wet chemical process such as buffered hydrofluoric acid, or by a dry process such as plasma or reactive ion etching.

Figure 1C:
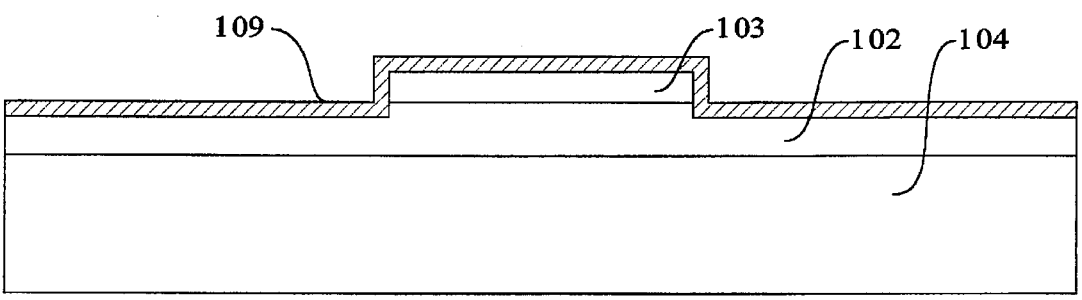

In FIG. 1C, crystalline silicon layer 102 may be partially etched as described above to form a mesa structure under silicon dioxide mesa 103. Preferably a minimum thickness of 100 nm of silicon should remain around the mesa structure. A layer of titanium 109 having a thickness of approximately 100 nm is deposited over the etched surfaces of crystalline silicon layer 102 and silicon dioxide mesa 103.

Figure 1D:
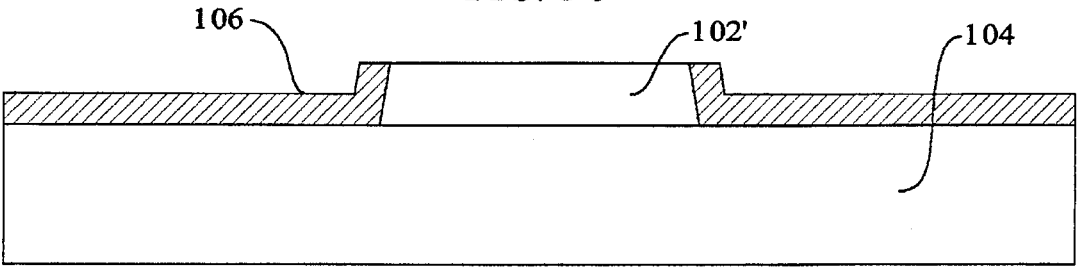

In FIG. 1D, a layer of titanium silicide 106 is formed by reacting crystalline silicon layer 102 and titanium layer 109. The unreacted titanium may be removed by wet etching, for example, after which silicon dioxide mesa 103 is removed to form a crystalline silicon mesa 102'.

Figure 1E:
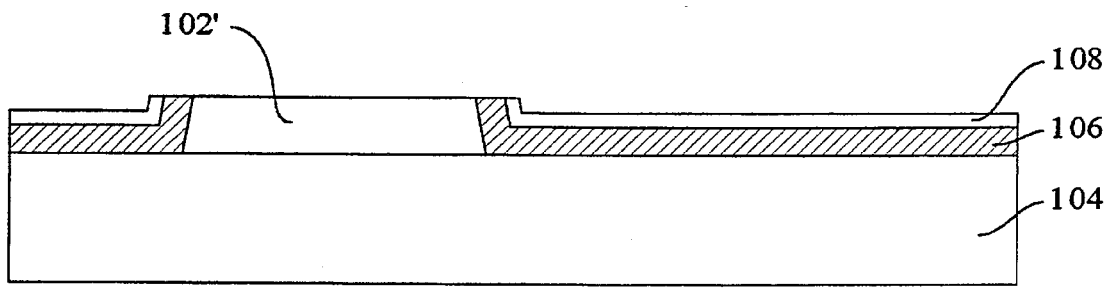

In FIG. 1E, an inner silicon dioxide layer 108 is deposited over titanium silicide layer 106 and crystalline silicon mesa 102'. Silicon dioxide layer 108 is then patterned and etched to expose crystalline silicon mesa 102'.

Figure 1F:
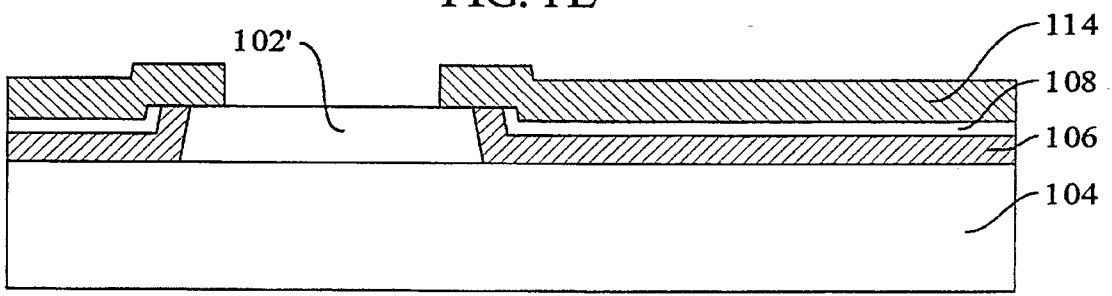

In FIG. 1F, a layer of silicon nitride 114 is deposited over silicon dioxide layer 108 and crystalline silicon mesa 102'. Silicon nitride layer 114 is then patterned and etched to expose crystalline silicon mesa 102'.

Figure 1G:
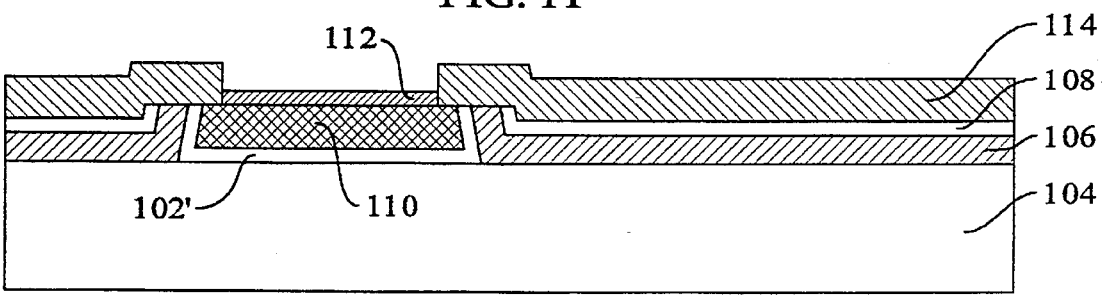

In FIG. 1G, a porous silicon region 110 is formed in crystalline silicon mesa 102' either chemically or electrochemically using titanium silicide layer 106 for electrical contact. The dimensions of the remainder of crystalline silicon mesa 102' may be modified as desired, and need not be totally consumed by the formation of porous silicon region 110. Aluminum is deposited, patterned, and etched to form aluminum electrode 112 on porous silicon region 110.

Figure 1H:
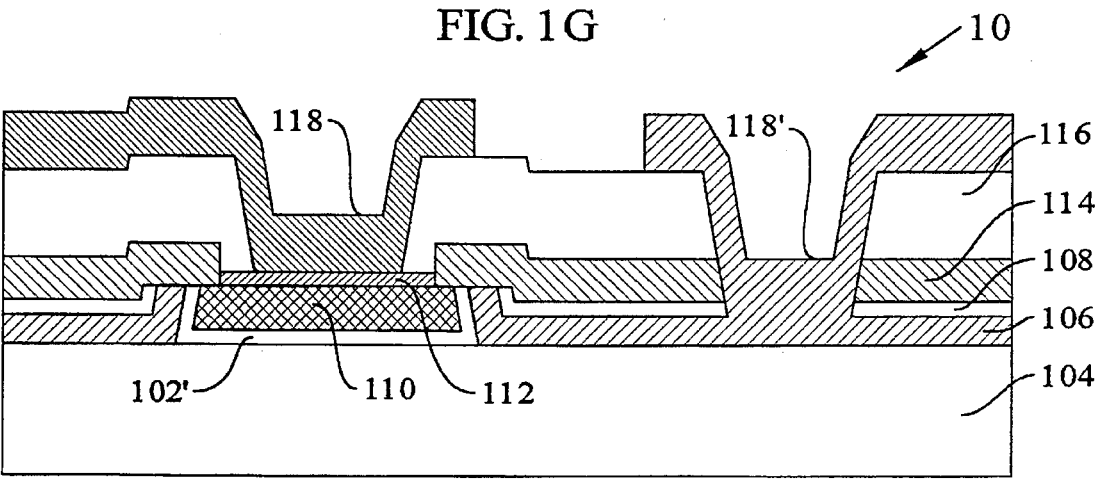

In FIG. 1H, an outer layer of silicon dioxide 116 is formed on silicon nitride layer 114 and aluminum electrode 112. Silicon dioxide layer 116 is patterned and etched to expose portions of aluminum electrode 112 and titanium silicide layer 106. Contact electrodes 118 and 118' are formed on silicon dioxide layer 116 by depositing, patterning, and etching an aluminum layer to make electrical contact with exposed areas on aluminum electrode 112 and silicide electrode 106, respectively.

The completed electroluminescent device 10 of FIG. 1H may be operated by applying a voltage between contact electrodes 118 and 118' to cause light to be emitted from porous silicon layer 110 through sapphire substrate 104.

Figure 2A:
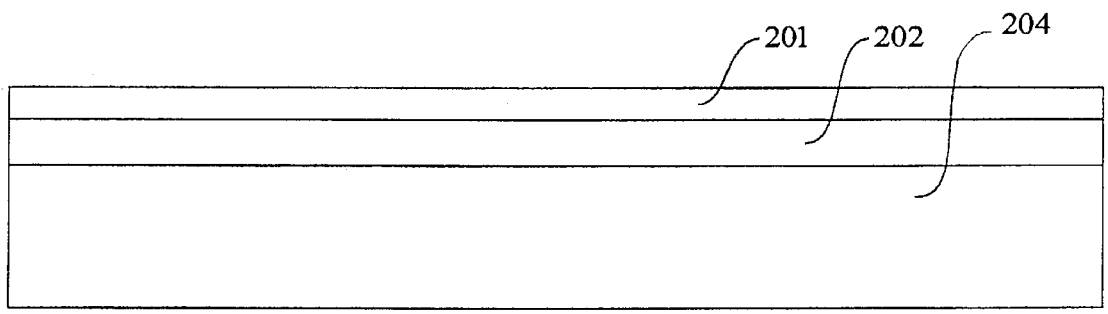
FIGS. 2A–2G are cross-sectional views of an electroluminescent device of the present invention made with porous silicon and a p-n junction.

An alternative embodiment of the electroluminescent device of the present invention comprises a p-n junction formed in the porous silicon. Referring to FIG. 2A, a layer of about 300 nm of n-type crystalline silicon 202 is deposited on a polished surface of a sapphire substrate 204. Improved silicon as described above may also be used for n-type crystalline silicon layer 202. A layer of silicon dioxide 201 is then deposited on n-type crystalline silicon layer 202.

Figure 2B:
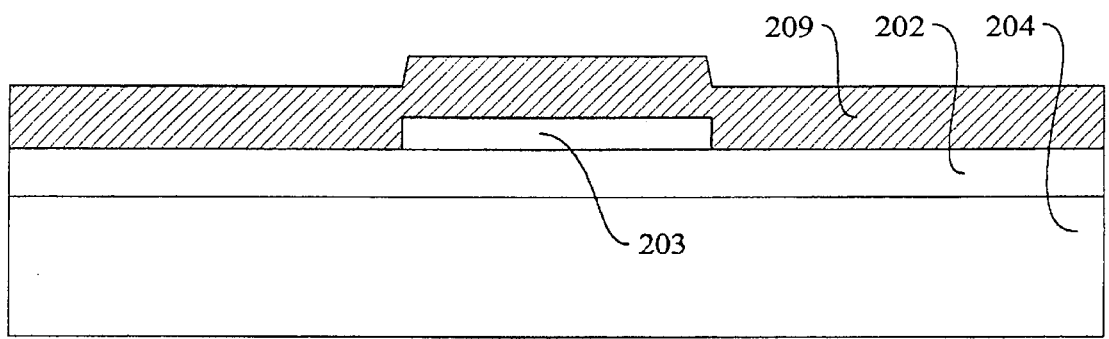

In FIG. 2B, silicon dioxide layer 201 is patterned into a mesa 203 by, for example, photolithography and etching with either a wet chemical process, such as buffered hydrofluoric acid, or a dry process such as plasma or reactive ion etching. A layer of titanium 209 is deposited on n-type crystalline silicon layer 202 and silicon dioxide mesa 203.

Figure 2C:
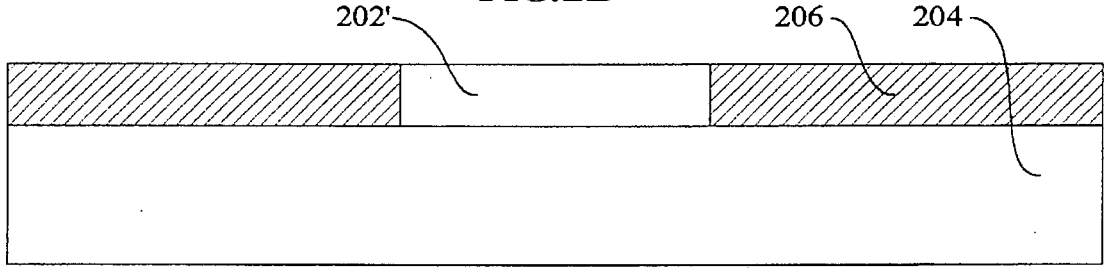

In FIG. 2C, crystalline silicon layer 202 and titanium layer 209 are reacted to form a titanium silicide electrode 206. The unreacted titanium and silicon oxide mesa 203 are removed to expose n-type crystalline silicon mesa 202'.

Figure 2D:
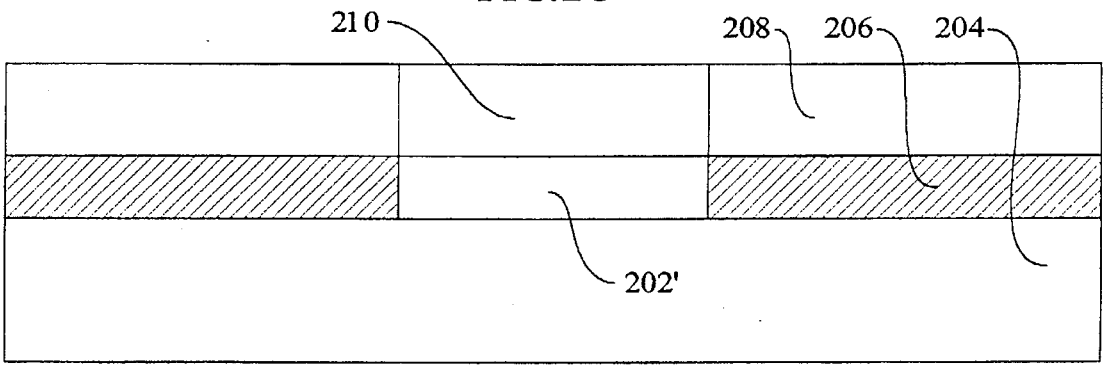

In FIG. 2D, an inner silicon dioxide layer 208 approximately 1 micron thick is deposited on titanium silicide electrode 206 and n-type crystalline silicon mesa 202'. Silicon dioxide layer 208 is patterned to expose n-type crystalline silicon mesa 202' by, for example, photolithography and etching as described above. A layer of p-type silicon 210 may then be deposited epitaxially on n-type crystalline silicon mesa 202'.

Figure 2E:
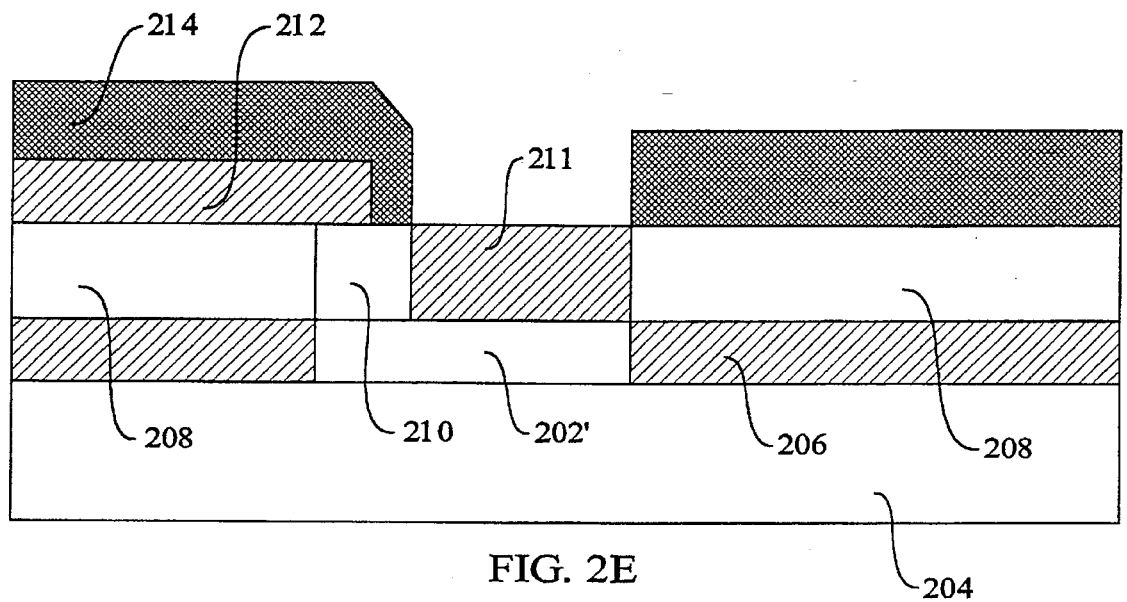

In FIG. 2E, a layer of aluminum is deposited patterned, and etched to form an aluminum electrode 212 over portions of p-type silicon layer 210 and inner silicon dioxide layer 208. An insulating layer of silicon nitride 214 is deposited, patterned, and etched over aluminum electrode 212 and silicon dioxide layer 208. A porous silicon region 211 may be formed in p-type silicon layer 210 either chemically or electrochemically, using aluminum electrode 212 for electrical contact. Alternatively, porous silicon region 211 may be formed to extend into p-type silicon layer 210 and n-type crystalline silicon mesa 202' by modifying the etch conditions to control the location of the p-n junction with respect to porous silicon region 211.

Figure 2F:
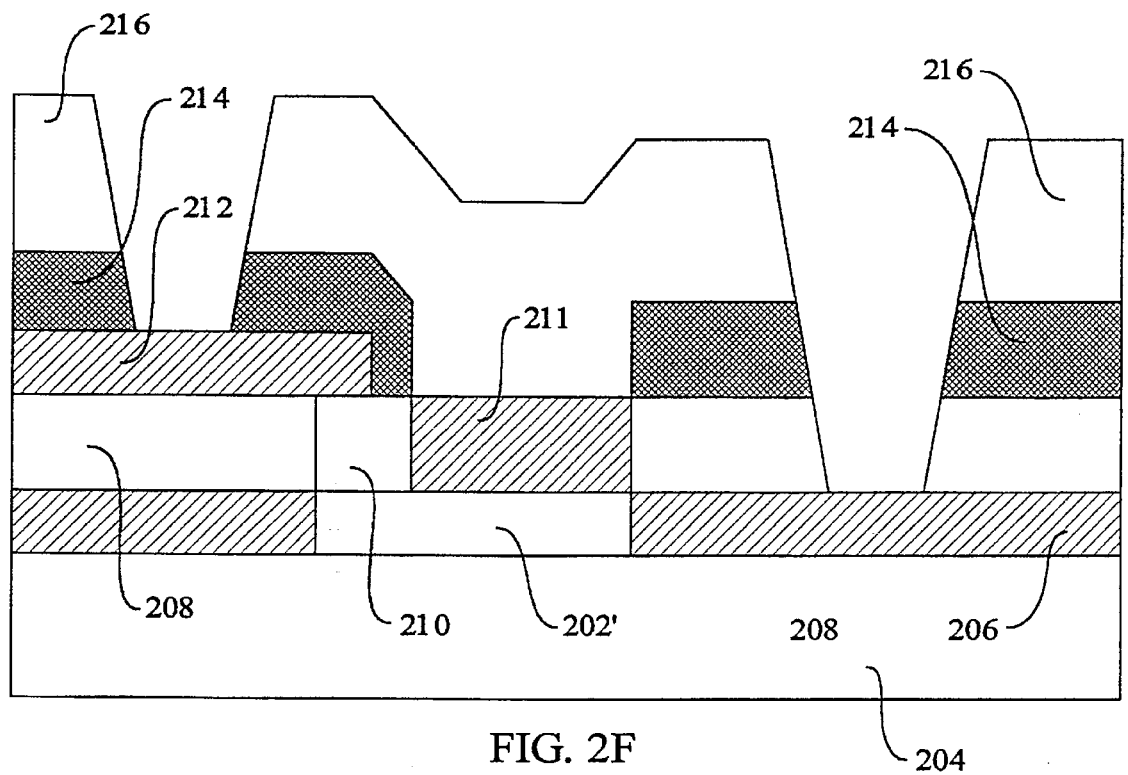

In FIG. 2F, silicon dioxide is deposited, patterned, and etched to form an insulating layer 216 over portions of silicon nitride layer 214 and porous silicon region 211.

Figure 2G:
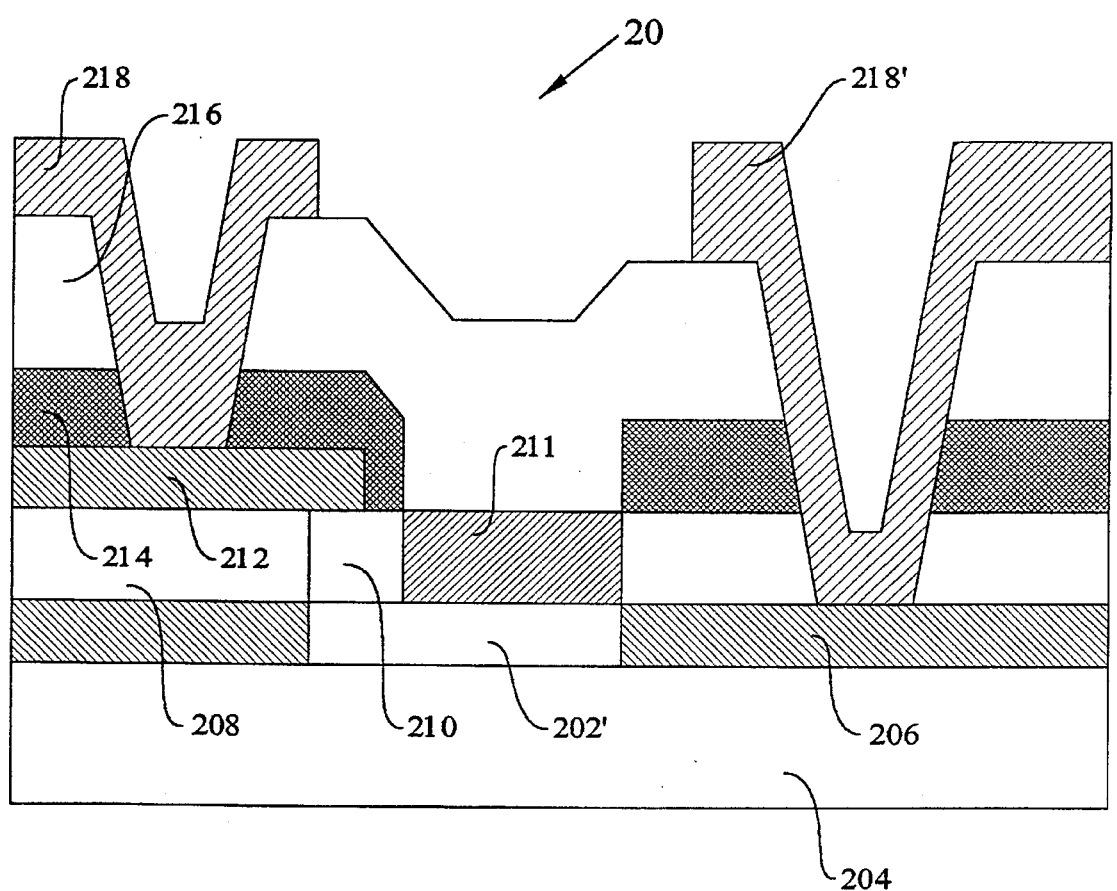

In FIG. 2G, contact electrodes 218 and 218' are formed through outer silicon dioxide layer 216 and silicon nitride layer 214 to make electrical contact with exposed areas on aluminum electrode 112 and titanium silicide electrode 206, respectively.

Completed electroluminescent device 20 may be operated by applying a voltage between contact electrodes 218 and 218' to cause light to be emitted from porous silicon layer 211 through sapphire substrate 204.

Instead of pure aluminum, aluminum in a compound of about 1% silicon or 0.5% to 1% copper may be used, as well as other opaque metallizations including tungsten, platinum, titanium, and their alloys. Also, bonded silicon on quartz may be used rather than silicon-on-sapphire for applications not requiring compatibility with standard semiconductor manufacturing processes. Other variations of fabrication processes may be used including additions and deletions of process steps as will be evident to those skilled in the art of semiconductor fabrication. For example, the use of ion implantation and the like may be used to form p-type and n-type junctions prior to the formation of porous silicon rather than the epitaxial deposition process descibed above.

Other optoelectronic devices such as phototransistors, cross-bar switches, light emitting arrays, and the like may be readily fabricated by incorporating the electroluminescent devices of the present invention.

A plurality of devices of the present invention may also be arranged advantageously to reduce the size, weight, and power consumption of optoelectronic applications.

Other modifications, variations, and applications of the present invention may be made in accordance with the above teachings other than as specifically described to practice the invention within the scope of the following claims.

We claim:

1. An electroluminescent device, comprising:

a light-transparent substrate;

a layer of single crystal silicon formed on a surface of said light-transparent substrate;

a mesa of porous silicon formed on said layer of single crystal silicon;

a silicide electrode formed in said layer of single crystal silicon operably coupled to said mesa of porous silicon; and a metallic electrode formed on said mesa of porous silicon.

2. The electroluminescent device of claim 1, further comprising:

an electrically insulating layer formed on said silicide electrode and said metallic electrode; p1 a first contact electrode formed on and through said electrically insulating layer operably coupled to said silicide electrode; and a second contact electrode formed on and through said electrically insulating layer operably coupled to said metallic electrode.

3. The electroluminescent device of claim 2, further comprising a voltage source operably coupled to said first and second contact electrodes for causing said device to emit light.

4. The electroluminescent device of claim 1, wherein said light-transparent substrate comprises at least one of sapphire and quartz.

5. The electroluminescent device of claim 2, wherein said silicide electrode comprises a silicide of at least one of tungsten, platinum, and titanium, and said metallic electrode comprises one of aluminum, aluminum and copper, tungsten, platinum, titanium, and alloys and silicides thereof.

6. The electroluminescent device of claim 2, wherein said electrically insulating layer further comprises at least one of silicon dioxide and silicon nitride.

7. The electroluminescent device of claim 1, wherein said silicide electrode comprises titanium silicide.

8. The electroluminescent device of claim 1, wherein said metallic electrode comprises aluminum.

9. The electroluminescent device of claim 1, wherein said layer of single crystal silicon comprises n-type and p-type dopants.

10. An electroluminescent device, comprising:
   a light-transparent substrate;
   a layer of n-type single crystal silicon formed on a surface of said substrate;
   a region of p-type silicon formed on said layer of said n-type single crystal silicon to form a p-n junction;
   a mesa of porous silicon formed in said p-n junction;
   a silicide electrode formed in said layer of n-type single crystal silicon; and
   a metallic electrode formed on said mesa of porous silicon.

11. The electroluminescent device of claim 10, further comprising:
   an electrically insulating layer formed on said silicide electrode and said metallic electrode;
   a first contact electrode formed on and through said electrically insulating layer operably coupled to said silicide electrode; and
   a second contact electrode formed on and through said electrically insulating layer operably coupled to said metallic electrode.

12. The electroluminescent device of claim 11, further comprising a voltage source operably coupled to said first and second contact electrodes for causing said device to emit light.

13. The electroluminescent device of claim 10, wherein said light-transparent substrate comprises at least one of sapphire and quartz.

14. The electroluminescent device of claim 11, wherein said silicide electrode comprises a silicide of at least one of tungsten, platinum, and titanium, and said metallic electrode comprises one of aluminum, aluminum and copper, tungsten, platinum, titanium, and alloys and silicides thereof.

15. The electroluminescent device of claim 11, wherein said electrically insulating layer further comprises at least one of silicon dioxide and silicon nitride.

16. The electroluminescent device of claim 10, wherein said silicide electrode comprises titanium silicide.

17. The electroluminescent device of claim 10, wherein said metallic electrode comprises aluminum.

18. The electroluminescent device of claim 10, wherein said mesa of porous silicon is formed within at least one of said region of p-type silicon and said layer of n-type silicon.

* * * * *